(12) United States Patent
Venkatasubramanian et al.

(10) Patent No.: US 11,784,042 B2
(45) Date of Patent: *Oct. 10, 2023

(54) CARBON HARD MASKS FOR PATTERNING APPLICATIONS AND METHODS RELATED THERETO

(71) Applicant: Applied Materials, Inc., Santa Clara, CA (US)

(72) Inventors: Eswaranand Venkatasubramanian, Santa Clara, CA (US); Yang Yang, San Diego, CA (US); Pramit Manna, Santa Clara, CA (US); Kartik Ramaswamy, San Jose, CA (US); Takehito Koshizawa, San Jose, CA (US); Abhijit Basu Mallick, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/961,224

(22) Filed: Oct. 6, 2022

(65) Prior Publication Data

US 2023/0021761 A1 Jan. 26, 2023

Related U.S. Application Data

(63) Continuation of application No. 17/045,453, filed as application No. PCT/US2019/026354 on Apr. 8, 2019, now Pat. No. 11,469,097.

(Continued)

(51) Int. Cl.
*H01L 21/02* (2006.01)
*H01L 21/033* (2006.01)
*C23C 16/26* (2006.01)

(52) U.S. Cl.
CPC ........ *H01L 21/02274* (2013.01); *C23C 16/26* (2013.01); *H01L 21/02115* (2013.01); *H01L 21/0332* (2013.01)

(58) Field of Classification Search
None
See application file for complete search history.

(56) References Cited

U.S. PATENT DOCUMENTS

| 4,783,368 A | 11/1988 | Yamamoto et al. |
| 5,352,493 A | 10/1994 | Dorfman et al. |

(Continued)

FOREIGN PATENT DOCUMENTS

| CN | 101064238 A | 10/2007 |
| JP | H07-242493 A | 9/1995 |

(Continued)

OTHER PUBLICATIONS

Taiwan Office Action dated Mar. 12, 2020, for Taiwan Patent Application No. 108112252.

(Continued)

*Primary Examiner* — Asok K Sarkar
(74) *Attorney, Agent, or Firm* — PATTERSON + SHERIDAN, LLP

(57) ABSTRACT

Embodiments herein provide methods of depositing an amorphous carbon layer using a plasma enhanced chemical vapor deposition (PECVD) process and hard masks formed therefrom. In one embodiment, a method of processing a substrate includes positioning a substrate on a substrate support, the substrate support disposed in a processing volume of a processing chamber, flowing a processing gas comprising a hydrocarbon gas and a diluent gas into the processing volume, maintaining the processing volume at a processing pressure less than about 100 mTorr, igniting and maintaining a deposition plasma of the processing gas by (Continued)

applying a first power to one of one or more power electrodes of the processing chamber, maintaining the substrate support at a processing temperature less than about 350° C., exposing a surface of the substrate to the deposition plasma, and depositing an amorphous carbon layer on the surface of the substrate.

20 Claims, 3 Drawing Sheets

Related U.S. Application Data

(60) Provisional application No. 62/655,049, filed on Apr. 9, 2018.

(56) References Cited

U.S. PATENT DOCUMENTS

| | | | |
|---|---|---|---|
| 5,378,316 | A | 1/1995 | Franke et al. |
| 5,470,661 | A | 11/1995 | Bailey et al. |
| 5,688,382 | A | 11/1997 | Besen et al. |
| 5,942,854 | A | 8/1999 | Ryoji et al. |
| 6,013,980 | A | 1/2000 | Goel et al. |
| 6,320,295 | B1 | 11/2001 | McGill et al. |
| 6,592,771 | B1 | 7/2003 | Yamanaka et al. |
| 6,900,002 | B1 | 5/2005 | Plat et al. |
| 7,166,336 | B1 | 1/2007 | Mori et al. |
| 7,268,846 | B2 | 9/2007 | Hwang et al. |
| 7,824,498 | B2 | 11/2010 | Parkhe et al. |
| 7,942,111 | B2 | 5/2011 | Burger et al. |
| 8,105,660 | B2 | 1/2012 | Tudhope et al. |
| 8,119,240 | B2 | 2/2012 | Cooper |
| 8,361,906 | B2 | 1/2013 | Lee et al. |
| 8,852,348 | B2 | 10/2014 | Parkhe et al. |
| 9,269,587 | B2 | 2/2016 | Shimizu et al. |
| 9,412,613 | B2 | 8/2016 | Manna et al. |
| 9,695,503 | B2 | 7/2017 | Stowell et al. |
| 9,695,593 | B2 | 7/2017 | Vokey et al. |
| 10,249,495 | B2 | 4/2019 | Yang et al. |
| 10,544,505 | B2 | 1/2020 | Yang et al. |
| 11,469,097 | B2 * | 10/2022 | Venkatasubramanian ............ H01L 21/02115 |
| 2001/0032591 | A1 | 10/2001 | Carducci et al. |
| 2003/0180459 | A1 | 9/2003 | Redeker et al. |
| 2004/0026235 | A1 | 2/2004 | Stowell |
| 2004/0045934 | A1 | 3/2004 | Harvey et al. |
| 2004/0261720 | A1 | 12/2004 | Tolmachev et al. |
| 2005/0056940 | A1 | 3/2005 | Sandhu et al. |
| 2005/0279624 | A1 | 12/2005 | Brcka |
| 2006/0093803 | A1 | 5/2006 | Hwang et al. |
| 2006/0246290 | A1 | 11/2006 | Oda et al. |
| 2006/0264063 | A1 | 11/2006 | Stern et al. |
| 2007/0104867 | A1 | 5/2007 | Haba |
| 2007/0275569 | A1 | 11/2007 | Moghadam et al. |
| 2008/0053819 | A1 | 3/2008 | Hong et al. |
| 2008/0085604 | A1 | 4/2008 | Toshino et al. |
| 2008/0099326 | A1 | 5/2008 | Ye et al. |
| 2008/0188090 | A1 | 8/2008 | Chen et al. |
| 2008/0194169 | A1 | 8/2008 | Sterling et al. |
| 2008/0277063 | A1 | 11/2008 | Shin |
| 2009/0029067 | A1 | 1/2009 | Sciamanna et al. |
| 2009/0047760 | A1 | 2/2009 | Yamazaki et al. |
| 2009/0186206 | A1 | 7/2009 | Ito et al. |
| 2009/0212010 | A1 | 8/2009 | Wang et al. |
| 2010/0093187 | A1 | 4/2010 | Lee et al. |
| 2010/0095979 | A1 | 4/2010 | Hua et al. |
| 2010/0218785 | A1 | 9/2010 | Green et al. |
| 2010/0291713 | A1 | 11/2010 | Lee et al. |
| 2011/0005681 | A1 | 1/2011 | Savas et al. |
| 2011/0017424 | A1 | 1/2011 | Parkhe et al. |
| 2011/0136286 | A1 | 6/2011 | Stewart et al. |
| 2011/0274852 | A1 | 11/2011 | Ito et al. |
| 2011/0287633 | A1 | 11/2011 | Lee et al. |
| 2012/0237693 | A1 | 9/2012 | Jackson et al. |
| 2012/0276743 | A1 | 11/2012 | Won et al. |
| 2013/0008603 | A1 | 1/2013 | Eto et al. |
| 2013/0034666 | A1 | 2/2013 | Liang |
| 2013/0146443 | A1 | 6/2013 | Papa et al. |
| 2013/0160794 | A1 | 6/2013 | Griffith Cruz et al. |
| 2013/0302996 | A1 | 11/2013 | Reilly et al. |
| 2014/0054658 | A1 | 2/2014 | Ma et al. |
| 2014/0170853 | A1 | 6/2014 | Shamma et al. |
| 2014/0273461 | A1 | 9/2014 | Lee et al. |
| 2014/0345802 | A1 | 11/2014 | Umehara et al. |
| 2014/0355912 | A1 | 12/2014 | Fortune |
| 2015/0200094 | A1 | 7/2015 | Underwood et al. |
| 2015/0348824 | A1 | 12/2015 | Kuenle et al. |
| 2015/0371851 | A1 | 12/2015 | Lee et al. |
| 2016/0042961 | A1 | 2/2016 | Dorf et al. |
| 2016/0053366 | A1 | 2/2016 | Stowell et al. |
| 2016/0179005 | A1 | 6/2016 | Shamma et al. |
| 2016/0276134 | A1 | 9/2016 | Collins et al. |
| 2016/0284538 | A1 | 9/2016 | Reilly et al. |
| 2016/0372307 | A1 | 12/2016 | Yang et al. |
| 2017/0040140 | A1 | 2/2017 | Tanaka et al. |
| 2017/0069464 | A1 | 3/2017 | Ye et al. |
| 2017/0103893 | A1 | 4/2017 | Kulshreshtha et al. |
| 2017/0330734 | A1 | 11/2017 | Lee et al. |
| 2017/0372899 | A1 | 12/2017 | Yang et al. |
| 2018/0096843 | A1 | 4/2018 | Kulshreshtha et al. |
| 2018/0274089 | A1 | 9/2018 | Yang et al. |
| 2018/0274100 | A1 | 9/2018 | Yang et al. |
| 2018/0358222 | A1 | 12/2018 | Venkatasubramanian et al. |
| 2018/0358229 | A1 | 12/2018 | Koshizawa et al. |
| 2019/0057839 | A1 | 2/2019 | Kellogg et al. |
| 2019/0057862 | A1 | 2/2019 | Yang et al. |
| 2019/0122889 | A1 | 4/2019 | Kulshreshtha et al. |
| 2019/0228970 | A1 | 7/2019 | Yang et al. |
| 2020/0144029 | A1 | 5/2020 | Gandikota et al. |

FOREIGN PATENT DOCUMENTS

| | | |
|---|---|---|
| JP | H11-150115 A | 6/1999 |
| JP | 2009505402 A | 2/2009 |
| JP | 2010021282 A | 1/2010 |
| JP | 2010024476 A | 2/2010 |
| JP | 2012233529 A | 11/2012 |
| JP | 2017504209 A | 2/2017 |
| JP | 2018536287 A | 12/2018 |
| KR | 20110115291 A | 10/2011 |
| KR | 20120121340 A | 11/2012 |
| TW | 468209 B | 12/2001 |
| TW | 200937517 A | 9/2009 |
| TW | 201204862 A | 2/2012 |
| TW | 201204862 A1 | 2/2012 |
| TW | 201438062 A | 10/2014 |
| TW | 201503228 A | 1/2015 |
| TW | 201730962 A | 9/2017 |
| TW | 201740539 | 11/2017 |
| TW | 201809339 A | 3/2018 |
| WO | 2011146212 A2 | 11/2011 |
| WO | 2018032684 A1 | 2/2018 |
| WO | 2018034811 A1 | 2/2018 |
| WO | 2019199681 A1 | 10/2019 |
| WO | 2019212592 A1 | 11/2019 |

OTHER PUBLICATIONS

International Search Report and the Written opinion of the International Searching Authority for PCT/US2019/026354 dated Jul. 23, 2019, 12 pages.

Taiwan Office Action dated Oct. 22, 2020, for Taiwan Patent Application No. 108112252.

Ban et al. "Diamond-like carbon films deposited by electron beam excited plasma chemical vapor deposition," Diamond and Related Materials, vol. 11, No. 7, Jul. 2002, pp. 1353-1359, <https://doi.org/10.1016/S0925-9635(01)00743-9>.

Ban et al. "Stress and structural properties of diamond-like carbon films deposited by electron beam excited plasma CVD," Diamond and Related Materials, vol. 12, No. 1, Jan. 2003, pp. 47-56, <https://doi.org/10.1016/S0925-9635(02)00265-0>.

(56) References Cited

OTHER PUBLICATIONS

Moushinho et al. "High density plasma chemical vapor deposition of diamond-like carbon films," Microelectronics Journal, vol. 34, Nos. 5-8, May-Aug. 2003, pp. 627-629, <https://doi.org/10.1016/S0026-2692(03)00065-X>.
Taiwan Office Action dated Jan. 5, 2022 for Application No. 108112252.
Chinese Search Report dated Dec. 16, 2021, for China Patent Application No. 202010963904.X.
Japanese Office Action dated Apr. 25, 2023 for Application No. 2020-554282.

\* cited by examiner

CARBON HARD MASKS FOR PATTERNING APPLICATIONS AND METHODS RELATED THERETO

CROSS-REFERENCE TO RELATED APPLICATION

This application is a continuation of U.S. patent application Ser. No. 17/045,453, filed Oct. 5, 2020, which is a National Phase Application under 35 U.S.C. 371 of International Application No. PCT/US2019/026354, filed Apr. 8, 2019, which claims priority to U.S. Provisional Patent Application No. 62/655,049 filed Apr. 9, 2018, each of which is incorporated by reference herein in their entireties.

BACKGROUND

Field

Embodiments described herein generally relate to the field of semiconductor device manufacturing, and more particularly, to amorphous carbon layers, and methods of depositing amorphous carbon layers, used in an electronic device manufacturing process.

Description of the Related Art

Carbon hard masks formed of amorphous carbon are used in semiconductor device manufacturing as an etching mask in forming high aspect ratio openings (e.g., a height to width ratio of 2:1 or more) in a substrate surface or in a material surface layer thereof. Generally, processing issues related to forming high aspect ratio openings, including clogging, hole-shape distortion, pattern deformation, top critical dimension blow up, line bending, and profile bowing are a result of undesirable material properties of conventionally deposited carbon hard masks. For example, carbon hard masks having one or a combination of lower material density and lower material rigidity (i.e., Young's modulus) are known to cause increased deformation of high aspect ratio openings when compared to hard mask materials having a higher density or higher rigidity. Likewise, both lower etch selectivity between hard mask materials and a to be etched substrate material disposed therebeneath and hard mask materials having higher film stress (compressive or tensile) are known to cause increased slit pattern deformation and line bending when compared to processes using hard mask materials with higher etch selectivity to the underlying substrate material and lower film stress. Further, as critical dimensions (CDs) shrink and the heights of high aspect ratio openings increase, the thickness of conventionally deposited carbon hardmask used to form the high aspect ratio openings also increases. Unfortunately, hard masks having lower transparency due to one or both of low optical K and increased thickness can cause alignment problems in subsequent photolithography processes. Hard mask materials with higher etch selectivity to the underlying substrate materials allow for reduced thickness compared to hard masks with lower etch selectivity and are therefore desirable. Further, processes having lower etch selectivity between the hard mask material and the underlying substrate material often rely upon relativity thicker hard masks which undesirably increase processing time and cost to deposit, leading to reduced substrate processing capacity and increased device costs.

Accordingly, what is needed in the art are improved amorphous carbon hard masks and improved methods of forming improved amorphous carbon hard masks.

SUMMARY

Embodiments of the present disclosure generally describe methods of depositing an amorphous carbon layer onto a substrate, including over previously formed layers on the substrate, using a plasma enhanced chemical vapor deposition (PECVD) process and hard masks formed therefrom.

In one embodiment, a method of processing a substrate includes positioning a substrate on a substrate support, the substrate support disposed in a processing volume of a processing chamber, flowing a processing gas comprising a hydrocarbon gas and a diluent gas into the processing volume, maintaining the processing volume at a processing pressure less than about 100 mTorr, igniting and maintaining a deposition plasma of the processing gas by applying a first power to one of one or more power electrodes of the processing chamber, maintaining the substrate support at a processing temperature less than about 350° C., exposing a surface of the substrate to the deposition plasma, and depositing an amorphous carbon layer on the surface of the substrate.

In another embodiment, a method of processing a substrate includes positioning a substrate on a substrate support, the substrate support disposed in a processing volume of a processing chamber, flowing a processing gas comprising a hydrocarbon gas and a diluent gas into the processing volume, maintaining the processing volume at a processing pressure less than about 20 mTorr, igniting and maintaining a deposition plasma of the processing gas by applying a first ac power one of one or more power electrodes of the substrate support, wherein the first ac power is between about 0.7 watts and about 15 watts per $cm^2$ of a substrate receiving surface of the substrate support, maintaining the substrate support at a processing temperature less than about 100° C., exposing a surface of the substrate to the deposition plasma, and depositing an amorphous carbon layer on the surface of the substrate.

In another embodiment, a carbon hard mask includes an amorphous carbon layer disposed on a surface of a substrate, wherein the amorphous carbon layer has a density of more than about 1.8 $g/cm^3$, a Young's modulus of more than about 50 GPa, a film stress less than about 500 MPa, and an absorption coefficient (optical K) of less than about 0.15 at a wavelength of about 633 nm.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of scope, for the disclosure may admit to other equally effective embodiments.

DETAILED DESCRIPTION

Embodiments of the present disclosure generally describe methods for depositing an amorphous carbon layer onto a substrate, including over previously formed layers on the substrate, using a plasma enhanced chemical vapor deposition (PECVD) process. In particular, the methods described herein provide for lower processing pressures, e.g., less than about 100 mTorr, lower processing temperatures e.g., less than about 350° C., and higher powers, e.g., more than about 1000 W, than typically used in conventional methods of depositing amorphous carbon layers. In some embodiments herein, the power used to ignite and maintain the deposition plasma is delivered to one or more power electrodes disposed in or coupled to a substrate support having the substrate disposed thereon. Each or combinations of lower processing pressures, lower processing temperatures, higher powers, and substrate level plasma (plasma formed through capacitive coupling with power electrodes of the substrate support) increase the ion energy at the substrate surface during deposition which results in an amorphous carbon layer having a desirably higher ratio of sp3 content (diamond like carbon) to sp2 content (graphite like carbon) when compared to conventional deposition methods. Because of the resulting higher sp3 content, the methods described herein provide amorphous carbon layers having improved density, rigidity, transparency, etch selectivity, and film stress when compared to conventionally deposited amorphous carbon layers.

Figure 1:
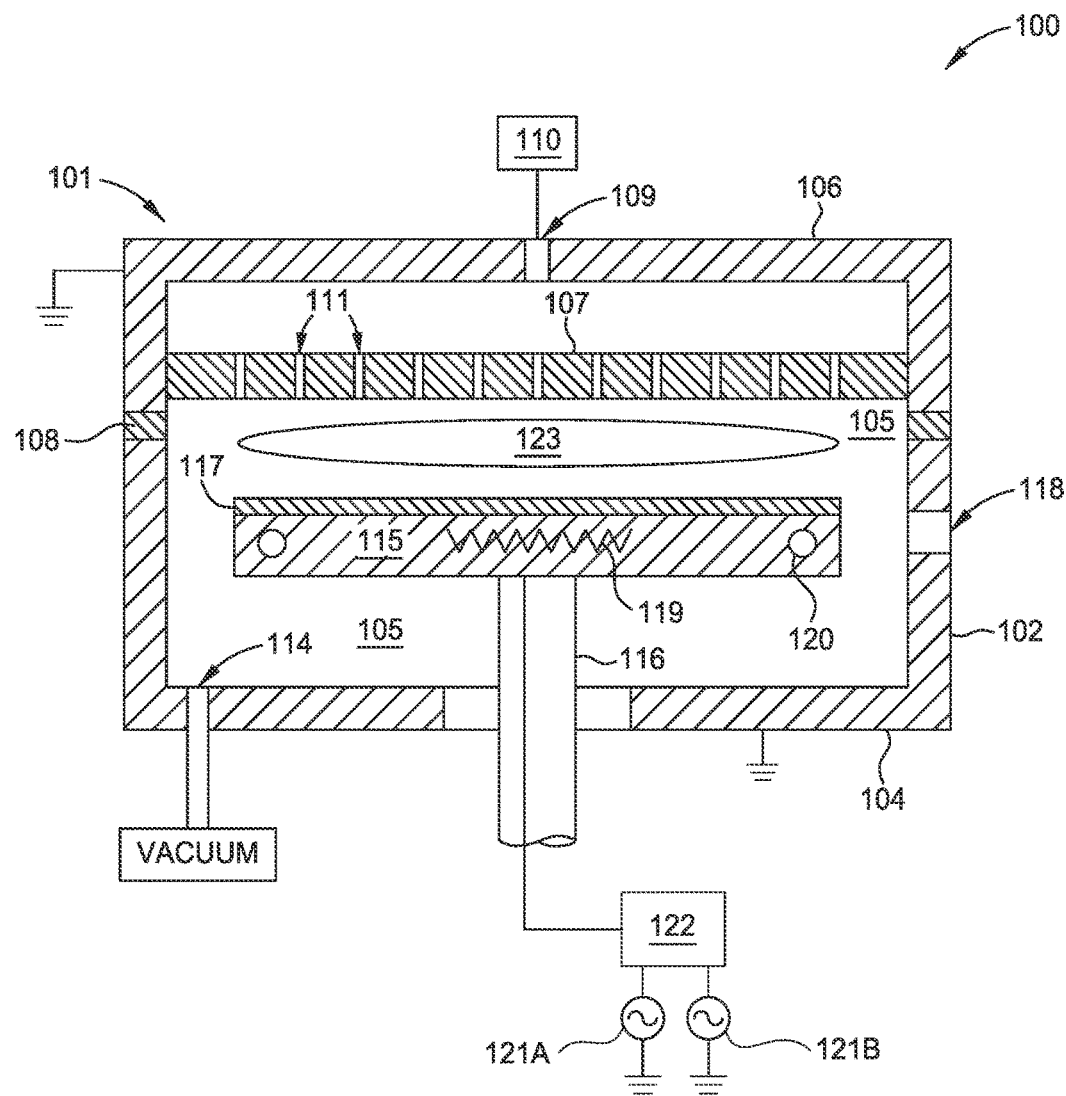
FIG. 1 is a schematic cross sectional view of an exemplary processing chamber used to practice the methods set forth herein, according to one embodiment.

FIG. 1 is a schematic cross sectional view of an exemplary processing chamber used to practice the methods set forth herein, according to one embodiment. Other exemplary processing chambers that may be used to practice the methods describe herein include Radion®, Producer®, and SYM3® processing chambers available from Applied Materials, Inc., of Santa Clara, Calif. as well as suitable deposition chambers from other manufacturers.

The processing chamber 100 includes a chamber lid assembly 101, one or more sidewalls 102, and a chamber base 104. The chamber lid assembly 101 includes a chamber lid 106, a showerhead 107 disposed in the chamber lid 106 and electrically coupled thereto, and an electrically insulating ring 108, disposed between the chamber lid 106 and the one or more sidewalls 102. The showerhead 107, the one or more sidewalls 102, and the chamber base 104 together define a processing volume 105. A gas inlet 109, disposed through the chamber lid 106 is fluidly coupled to a gas source 110. The showerhead 107, having a plurality of openings 111 disposed therethrough, is used to uniformly distribute processing gases from the gas source 110 into the processing volume 105. Herein, the chamber lid assembly 101, and thus the showerhead 107, is electrically coupled to an earthen ground. In other embodiments, the chamber lid assembly 101, and thus the showerhead 107 disposed therein, is electrically coupled to a power supply (not shown), such as a continuous wave (CW) RF power supply, a pulsed RF power supply, a DC power supply, a pulsed DC power supply, or a combination thereof, which deliver one or more bias voltages thereto. In other embodiments, the processing chamber 100 does not include a showerhead 107 and processing gases are delivered to the processing volume 105 through one or more gas inlets disposed through the chamber lid 106 or the one or more sidewalls 102.

Herein, the processing volume 105 is fluidly coupled to a vacuum source, such as to one or more dedicated vacuum pumps, through a vacuum outlet 114, which maintains the processing volume 105 at sub-atmospheric conditions and evacuates the processing gas and other gases therefrom. A substrate support 115, disposed in the processing volume 105, is disposed on a movable support shaft 116 sealingly extending through the chamber base 104, such as being surrounded by bellows (not shown) in the region below the chamber base 104. Herein, the processing chamber 100 is configured to facilitate transferring of a substrate 117 to and from the substrate support 115 through an opening 118 in one of the one or more sidewalls 102, which is sealed with a door or a valve (not shown) during substrate processing.

Typically, the substrate 117, disposed on the substrate support 115, is maintained at a desired processing temperature using one or both of a heater, such as a resistive heating element 119, and one or more cooling channels 120 disposed in the substrate support 115. The one or more cooling channels 120 are fluidly coupled to a coolant source (not shown), such as a modified water source having relatively high electrical resistance or a refrigerant source.

In some embodiments, one or more power electrodes (not shown) embedded in a dielectric material of the substrate support 115 or coupled thereto are coupled to one or more RF or other ac frequency power supplies, such as the first power supply 121A and the second power supply 121B, through a matching circuit 122. Herein, a deposition plasma 123 is ignited and maintained in the processing volume 105 by capacitively coupling processing gases therein with one of one or more power electrodes at an ac power delivered thereto from the first power supply 121A. In some embodiments, the deposition plasma 123 is further maintained by capacitive coupling with one of the one or more power electrodes at an ac power delivered thereto from the second power supply 121B. Herein, the first power supply 121A and the second power supply 121B each deliver an ac power having a frequency between about 350 kHz and about 100 MHz, where the frequency of the power from the first power supply 121A is different than a frequency from the second power supply 121B.

Figure 2:
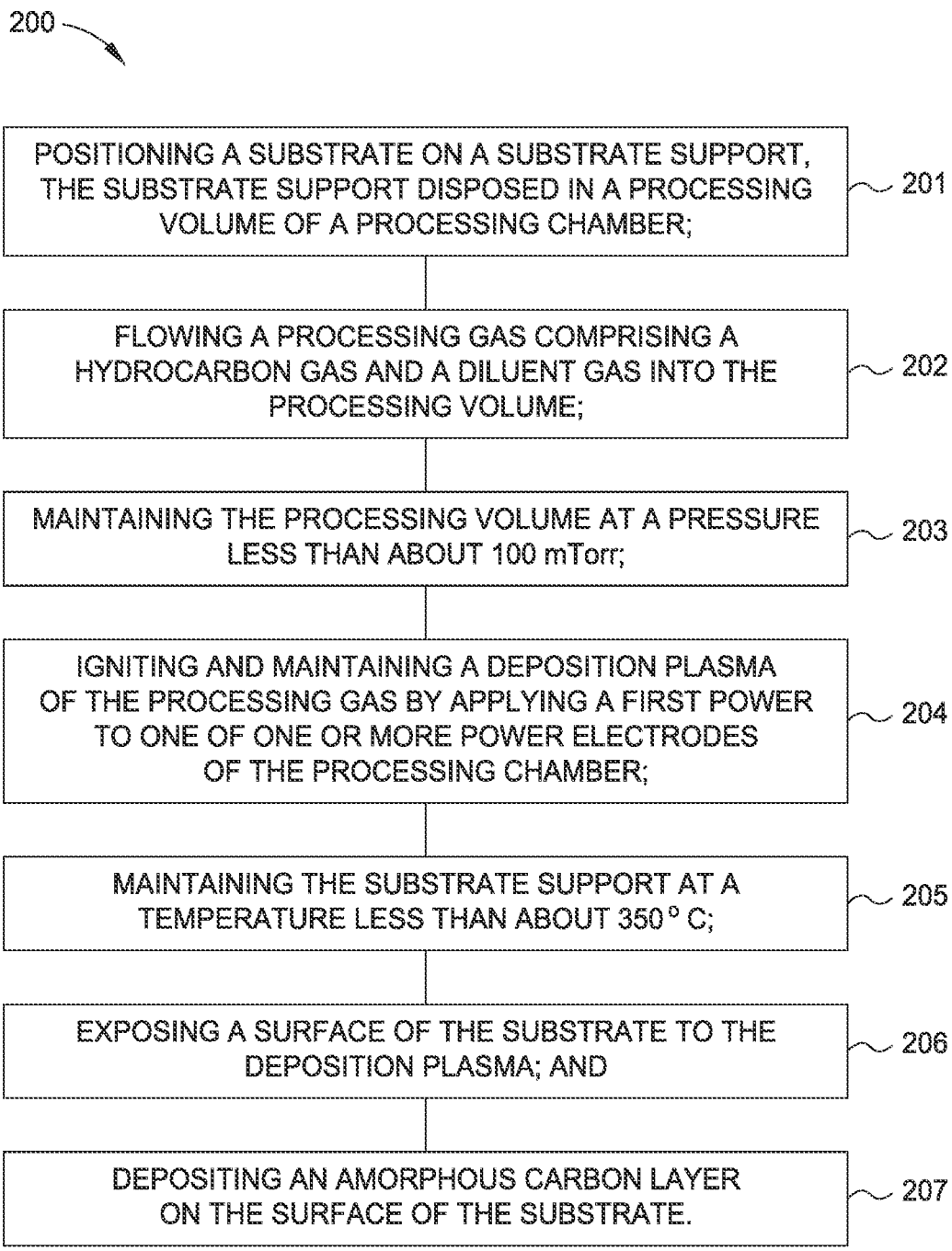
FIG. 2 is a flow diagram of a method of depositing an amorphous carbon layer, according to one embodiment.

FIG. 2 is a flow diagram of a method of depositing an amorphous carbon layer on a surface of a substrate, according to one embodiment. At activity 201 the method 200 includes positioning a substrate on a substrate support. Herein, the substrate support is disposed in a processing volume of a processing chamber, such as the processing chamber 100 described in FIG. 1. At activity 202 the method 200 includes flowing a processing gas into the processing volume. Typically, the processing gas includes a carbon source gas, such as a hydrocarbon gas, for example $CH_4$, $C_2H_2$, $C_3H_8$, $C_4H_{10}$, $C_2H_4$, $C_3H_6$, $C_4H_8$, and $C_5H_{10}$, or a combination thereof, and a diluent gas for example an inert gas, such as Ar, He, Ne, Kr, or Xe, or combinations thereof. In some embodiments, the diluent gas comprises an inert gas $N_2$, $H_2$, or combinations thereof. In some embodiments, a ratio of the flowrate, (hereafter ratio), of the hydrocarbon gas to the diluent gas is between about 1:10 and about 10:1, such as between about 1:5 and about 5:1. For example in one embodiment a ratio of $C_2H_2$ to He is between about 1:3 and about 3:1. In some embodiments, the diluent gas comprises $H_2$ and a ratio between $H_2$ and the carbon source gas is between about 0.5:1 and about 1:10, such as between about 1:1 and about 1:5. At activity 203 the method 200 includes maintaining the processing volume at a processing pressure between about 0.1 mTorr and about 100 mTorr, such as between about 0.1 mTorr and about 50 mTorr, between 0.1 mTorr and about 30 mTorr, between about 0.1 mTorr and about 20 mTorr, between about 0.1 mTorr and about 15 mTorr, for example between about 0.1 mTorr and about 10 mTorr, or less than about 100 mTorr, less than about 50 mTorr, less than about 20 mTorr, less than about 15 mTorr, for example about less than about 10 mTorr.

At activity 203 the method 200 includes igniting and maintaining a deposition plasma of the processing gas by applying a first power to one of one or more power electrodes of the processing chamber. Herein, the one or more power electrodes are one of one or more top electrodes (e.g., a chamber lid of the processing chamber or a showerhead disposed in the chamber lid), one or more side electrodes (e.g., one or more sidewalls of the processing chamber), or are part of the substrate support (e.g., one or more electrodes embedded in or coupled to a dielectric material of the substrate support). Typically, the first power is between about 500 W and about 8 kW, such as between about 1000 W and about 5 kW, for a processing chamber sized to process a 300 mm diameter substrate. Appropriate scaling may be used for processing chambers sized to process different sized substrates.

In some embodiments, the one or more power electrodes are one or a combination of embedded in or coupled to a dielectric material of the substrate support. In some embodiments, the first power is an RF or other ac frequency power between about 0.7 W and about 11.3 W per $cm^2$ of a substrate receiving surface of the substrate support, herein $W/cm^2$, such as between about 1.4 $W/cm^2$ and about 7.1 $W/cm^2$, or between about 500 W and about 5 kW for a substrate support having a substrate receiving surface sized to support a 300 mm diameter substrate, such as between about 1000 W and about 5 kW.

In some embodiments, the method 200 further includes applying a second power to one of the one or more power electrodes, where the second power is an RF or other ac frequency power between about 0.14 $W/cm^2$ and about 7.1 $W/cm^2$, such as between about 0.14 $W/cm^2$ and about 3.5 $W/cm^2$, or between about 100 W and about 5 kW, for a substrate support having a substrate receiving surface sized to support a 300 mm diameter substrate, such as between about 100 W and about 2.5 kW. Herein, a frequency of the second power is different from a frequency of the first power. Typically, frequencies of one or both of the first power and the second power are between about 350 kHz and about 100 MHz, such as about 350 KHz, about 2 MHz, about 13.56 MHz, about 27 MHz, about 40 MHz, about 60 MHz, and about 100 MHz. In some embodiments, the first power and the second power are applied to different power electrodes which are electrically isolated from one another, for example dual power electrodes embedded in, and isolated from one another by, a dielectric material of a substrate support. In some embodiments, the first power and the second power are applied to the same power electrode using a conventional impedance matching circuit.

At activity 204 the method 200 includes maintaining the substrate support, and thus the substrate disposed thereon, at a temperature between about −50° C. and about 350° C., such as between about −50° C. and about 150° C., between about −50° C. and about 100° C., or between about −50° C. and about 50° C., for example between about −25° C. and about 25° C. or a temperature less than about 350° C., such as less than about 200° C., less than about 150° C., or less than about 100° C., for example less than about 50° C.

At activities 205 and 206 the method 200 respectively includes exposing a surface of the substrate to the deposition plasma and depositing an amorphous carbon layer on the surface of the substrate.

Figure 3:
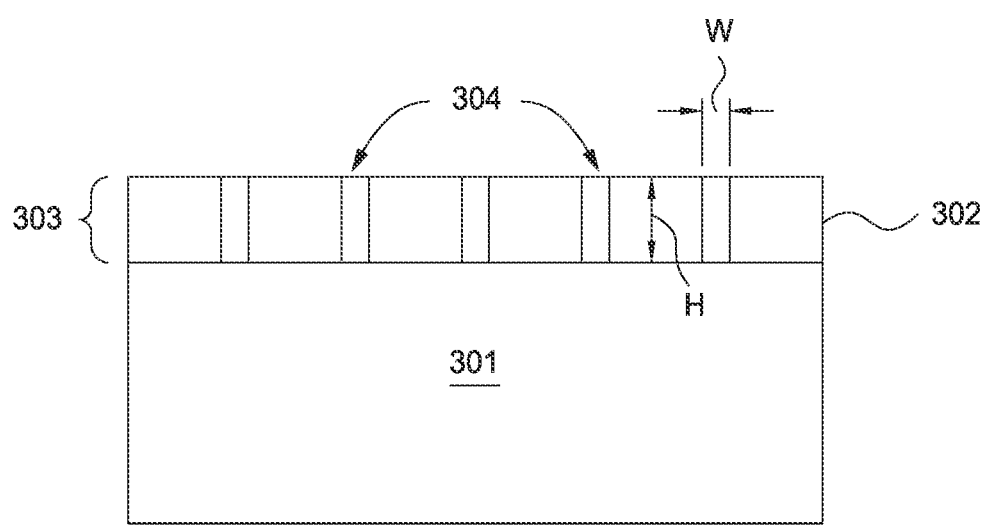
FIG. 3 illustrates a carbon hard mask formed of an amorphous carbon layer deposited according to the method set forth in FIG. 2, according to one embodiment.

FIG. 3 illustrates a carbon hard mask deposited according to the method set forth in FIG. 2, according to one embodiment. In FIG. 3 the carbon hard mask 303, herein a patterned carbon hard mask, includes an amorphous carbon layer 302, having a plurality of openings 304 formed therein, disposed on a to-be-patterned surface of a substrate 300. Typically, the substrate 300 or one or more material layers thereof are formed of one or a combination of crystalline silicon, silicon oxide, silicon oxynitride, silicon nitride, strained silicon, silicon germanium, tungsten, titanium nitride, doped or undoped polysilicon, carbon doped silicon oxides, silicon nitrides, doped silicon, germanium, gallium arsenide, glass, sapphire, and low k dielectric materials.

Herein, the amorphous carbon layer has a thickness between about 1 kÅ and about 40 kÅ, such as between about 10 kA and about 40 kÅ, for example between about 10 kÅ and about 30 kÅ, a density of more than about 1.8 $g/cm^3$, a Young's modulus of more than about 50 GPa, and an absorption coefficient (optical K) of less than about 0.15 at a wavelength of about 633 nm. In some embodiments, the amorphous carbon layer has a tensile or compressive film stress of less than about 500 MPa. In some embodiments, the amorphous carbon layer has a tensile film stress of less than about 500 MPa. In some embodiments, each of the openings 304 have an aspect ratio (height to width) of more than about 2:1, such as more than about 3:1, more than about 4:1, more than about 5:1, more than about 6:1, more than about 7:1, more than about 8:1, more than about 9:1, for example more than about 10:1.

The methods described herein provide amorphous carbon layers, and carbon hard masks formed therefrom, having improved density, rigidity, transparency, etch selectivity, and stress when compared to conventionally deposited amorphous carbon layers. Further, the methods described herein are desirably compatible with current carbon hard mask process integration schemes which means that introduction of the methods into existing device manufacturing lines will not require substantial changes in upstream or downstream processing methods or equipment related thereto.

While the foregoing is directed to embodiments of the present disclosure, other and further embodiments of the disclosure may be devised without departing from the basic scope thereof, and the scope thereof is determined by the claims that follow.

The invention claimed is:
1. A method of processing a substrate, comprising:
positioning a substrate on a substrate support, the substrate support disposed in a processing volume of a processing chamber;
flowing a processing gas comprising a hydrocarbon gas and a diluent gas into the processing volume;
maintaining the processing volume at a processing pressure less than about 100 mTorr;
igniting and maintaining a deposition plasma of the processing gas by applying a first power to one of one or more power electrodes of the processing chamber;
maintaining the substrate support at a processing temperature less than about 350° C.; and
depositing an amorphous carbon layer on a surface of the substrate, the deposited amorphous carbon layer having a film stress with an absolute value less than about 500 MPa.

2. The method of claim 1, wherein the deposited amorphous carbon layer has a density of more than about 1.8 g/cm$^3$.

3. The method of claim 1, wherein the deposited amorphous carbon layer has a Young's modulus of more than about 50 GPa.

4. The method of claim 1, wherein the diluent gas comprises a material, and a ratio of the material to hydrocarbon gas in the processing gas is between about 0.5:1 and about 1:10.

5. The method of claim 4, wherein the ratio is between about 1:1 and about 1:5.

6. The method of claim 1, wherein the diluent gas comprises one or more of Ar, He, Ne, Kr, Xe, $N_2$, or $H_2$.

7. The method of claim 1, wherein the deposited amorphous carbon layer has an absorption coefficient (optical K) of less than about 0.15 at a wavelength of about 633 nm.

8. The method of claim 1, wherein the deposited amorphous carbon layer has a density of more than about 1.8 g/cm$^3$, a Young's modulus of more than about 50 GPa, and an absorption coefficient (optical K) of less than about 0.15 at a wavelength of about 633 nm.

9. The method of claim 1, wherein the hydrocarbon gas comprises one or more of $CH_4$, $C_2H_2$, $C_3H_8$, $C_4H_{10}$, $C_2H_4$, $C_3H_6$, $C_4H_8$, or $C_5H_{10}$.

10. The method of claim 9, wherein a ratio of hydrocarbon gas to diluent gas is between about 1:10 and about 10:1.

11. The method of claim 9, wherein the processing temperature is less than about 100° C.

12. The method of claim 11, wherein the processing pressure is less than about 20 mTorr.

13. The method of claim 12, wherein the diluent gas comprises a material, and a ratio of the material to hydrocarbon gas in the processing gas is between about 0.5:1 and about 1:10.

14. The method of claim 12, wherein the first power is an ac power between about 0.7 W and about 11.3 W per cm$^2$ of a substrate receiving surface of the substrate support, wherein the first power has a frequency between about 350 kHz and about 100 MHz.

15. The method of claim 14, further comprising applying a second power to one of the one or more power electrodes, wherein the second power is an ac power between about 0.14 W and about 11.3 W per cm$^2$ of the substrate receiving surface of the substrate support, wherein the second power has a frequency between about 350 kHz and about 100 MHz, and wherein the frequency of the first power is different than the frequency of the second power.

16. A method of processing a substrate, comprising:
positioning a substrate on a substrate support, the substrate support disposed in a processing volume of a processing chamber;
flowing a processing gas comprising a hydrocarbon gas and a diluent gas into the processing volume;
maintaining the processing volume at a processing pressure less than about 20 mTorr;
igniting and maintaining a deposition plasma of the processing gas by applying a first ac power to one of one or more power electrodes of the substrate support, wherein the first ac power is between about 0.7 watts and about 15 watts per cm$_2$ of a substrate receiving surface of the substrate support;
maintaining the substrate support at a processing temperature less than about 100° C.; and
depositing an amorphous carbon layer on a surface of the substrate, the deposited amorphous carbon layer having a film stress with an absolute value less than about 500 MPa.

17. The method of claim 16, wherein the hydrocarbon gas comprises one or more of $CH_4$, $C_2H_2$, $C_3H_8$, $C_4H_{10}$, $C_2H_4$, $C_3H_6$, $C_4H_8$, or $C_5H_{10}$.

18. The method of claim 16, wherein the diluent gas comprises a material, and a ratio of the material to hydrocarbon gas in the processing gas is between about 0.5:1 and about 1:10.

19. The method of claim 16, further comprising applying a second ac power to one of the one or more power electrodes of the substrate support, wherein the second ac power is between about 0.14 W and about 7.1 W per cm$^2$ of the substrate receiving surface of the substrate support, wherein the first ac power and the second ac power each have a frequency between about 350 kHz and about 100 MHz, and wherein the frequency of the first ac power is different than the frequency of the second ac power.

20. A method of processing a substrate, comprising:
positioning a substrate on a substrate support, the substrate support disposed in a processing volume of a processing chamber;
flowing a processing gas comprising a hydrocarbon gas and a diluent gas into the processing volume, the diluent gas comprising one or more of Ar, He, Ne, Kr, Xe, $N_2$, or $H_2$, and the hydrocarbon gas comprising one or more of $CH_4$, $C_2H_2$, $C_3H_8$, $C_4H_{10}$, $C_2H_4$, $C_3H_6$, $C_4H_8$, or $C_5H^{10}$;
maintaining the processing volume at a processing pressure;
igniting and maintaining a deposition plasma of the processing gas by applying a first power to one of one or more power electrodes of the processing chamber;
maintaining the substrate support at a processing temperature less than about 350° C.; and
depositing an amorphous carbon layer on a surface of the substrate, the deposited amorphous carbon layer having a film stress with an absolute value less than about 500 MPa.

* * * * *